(12) United States Patent
Choi et al.

(10) Patent No.: US 7,746,118 B2
(45) Date of Patent: Jun. 29, 2010

(54) SINGLE ELECTRON BASED FLEXIBLE MULTI-FUNCTIONAL LOGIC CIRCUIT AND THE TRANSISTOR THEREOF

(75) Inventors: Jung Bum Choi, Cheongju-si (KR); Cang Keun Lee, Seoul (KR); Sang Jin Kim, Cheongwon-gun (KR); Jae Ho Hwang, Bonghwa-gun (KR)

(73) Assignee: Changbuk National University Industry-Academic Cooperation Foundation, Chungcheongbuk-Do (KR)

( * ) Notice: Subject to any disclaimer, the term of this patent is extended or adjusted under 35 U.S.C. 154(b) by 0 days.

(21) Appl. No.: 12/281,846

(22) PCT Filed: Sep. 11, 2007

(86) PCT No.: PCT/KR2007/004383

§ 371 (c)(1),
(2), (4) Date: Sep. 5, 2008

(87) PCT Pub. No.: WO2008/075826

PCT Pub. Date: Jun. 26, 2008

(65) Prior Publication Data

US 2009/0251172 A1 Oct. 8, 2009

(30) Foreign Application Priority Data

Dec. 19, 2006 (KR) ...................... 10-2006-0130097

(51) Int. Cl.
*H03K 19/20* (2006.01)

(52) U.S. Cl. ...................................... 326/104; 326/136
(58) Field of Classification Search ................. 326/1–7, 326/104, 109, 112, 136
See application file for complete search history.

(56) References Cited

U.S. PATENT DOCUMENTS 5,677,637 A * 10/1997 Nakazato et al. .............. 326/35

FOREIGN PATENT DOCUMENTS

| JP | 2001-119038 A | 4/2001 |
| JP | 2002-289833 A | 10/2002 |
| JP | 2004-281465 A | 10/2004 |

OTHER PUBLICATIONS

International Search Report from corresponding PCT application (PCT/KR2007/004383) (2 pgs.).

* cited by examiner

*Primary Examiner*—Don P Le
(74) *Attorney, Agent, or Firm*—Hiscock & Barclay, LLP

(57) ABSTRACT

The present invention relates to a flexible multi-functional logic circuit which switches a current direction to a serial or parallel direction using at least two single electron transistors (SETs) having the same pattern and as many field effect transistors (FETs) as the number of the single electron transistors and performs operations on multi-valued signals using Coulomb oscillation that is the unique characteristic of SET to enable conversion of a single logic circuit to four basic logic circuits of NAND, OR, NOR and AND gates and a device using the same.

9 Claims, 6 Drawing Sheets

SINGLE ELECTRON BASED FLEXIBLE MULTI-FUNCTIONAL LOGIC CIRCUIT AND THE TRANSISTOR THEREOF

TECHNICAL FIELD

The present invention relates to a flexible multi-functional logic circuit and a device using the same, and more particularly, to a flexible multi-functional logic circuit which switches a current direction to a serial or parallel direction using at least two single electron transistors (SETs) having the same pattern and as many field effect transistors (FETs) as the number of the single electron transistors and performs operations on multi-valued signals using Coulomb oscillation that is the unique characteristic of SET to enable conversion of a single logic circuit to four basic logic circuits of NAND, OR, NOR and AND gates and a device using the same.

BACKGROUND ART

In general, approaches of nano technology can be divided into a top-down method and a bottom-up method. The top-down method is a technique of gradually decreasing sizes of materials or semiconductor devices. For example, the top-down method develops the existing device into MEMS (Micro electro-mechanical system) and NEMS (Nano electro-mechanical system). The button-up method, which has recently become distinguished in the nano technology, makes a larger device using electrons, molecules or nano blocks. For example, the bottom-up method includes a technique that synthesizes a larger structure or develops a new medicine in the bio-technology field using nano tubes.

Recently, the semiconductor field has employed the bottom-up method as an approach of nano technology. For example, CMOS (Complementary Metal Oxide Semiconductor) based logic circuits are used as semiconductor devices used in notebook computers or mobiles.

CMOS devices are constructed in such a manner that a P-channel transistor and an N-channel transistor form an inverter circuit to reduce power consumption in silicon semiconductor device technology and widely used for semiconductor devices with a low operating speed and very low power consumption, pocket calculators, wrist watches and the like.

DISCLOSURE

Technical Problem

However, conventional CMOS devices have the following problems.

Firstly, ten-thousand to million electrons should move to process a 1-bit signal when an operation is performed on inputs 1 (ON) and 0 (OFF) according to whether current flows in a cell. Accordingly, the temperature of a circuit employing a conventional CMOS device increases to the sun's surface temperature due to high power consumption when integration of semiconductor devices is improved to enter a tera-grade era.

Furthermore, a 64 Mb DRAM based on CMOS technology requires million electrons to store 1 bit, and thus a large amount of power is needed to charge charges greater than thermal noise to recognize data.

Moreover, a conventional binary logic type device performs an operation on two inputs 0 and 1, and thus the device has a limited degree of integration.

In addition, to construct a logic device that performs four operations according to a conventional method, logic circuits for the respective operations must be fabricated on respective substrates. This requires high manufacturing cost and time.

Therefore, a technique of manufacturing a single electron transistor operating by a single electron, which aims at ultra-high integration, ultra-high speed and low power consumption, is required as an important core technique serving as an intermediate bridge between the two streams of nano technology, that is, the bottom-up method and the top-down method.

Technical Solution

To solve the aforementioned problems, the present invention provides a single electron based flexible multi-functional logic circuit comprising: first and second single electron transistors SET1 and SET2 respectively having side gates Gate1 and Gate2 and input voltage ports Vin1 and Vin2; a constant current source VD for supplying a predetermined current; a first field effect transistor FET1 for maintaining a predetermined drain voltage applied to the first and second single electron transistors SET1 and SET2 by the constant current source VD; at least a second field effect transistor FET2 for determining flow of current to the first and second single electron transistors SET1 and SET2; and two ports Port1 and Port2 for changing a current flow direction depending on whether the second field effect transistor FET2 is turned on or off.

The first and second single electron transistors SET1 and SET2 are connected in parallel with each other to construct a logic NOR circuit when the second field effect transistor FET2 is turned on. A voltage is applied to the side gates of the first and second single electron transistors SET1 and SET2 to control phases of Coulomb oscillations of the first and second single electron transistors by 180° to construct a logic AND circuit when the second field effect transistor FET2 is turned on.

The first and second single electron transistors SET1 and SET2 are serially connected to construct a logic NAND circuit when the second field effect transistor FET2 is turned off. A voltage is applied to the side gates of the first and second single electron transistors SET1 and SET2 to control phases of Coulomb oscillations of the first and second single electron transistors by 180° to construct a logic OR circuit when the second field effect transistor FET2 is turned off.

The second field effect transistor FET2 is a depletion transistor.

The side gates Gate1 and Gate2 change a phase difference of Coulomb oscillations by 180°.

The present invention also provides a single electron based flexible multi-functional logic circuit comprising: an active region defined in an insulating layer formed on a semiconductor substrate such that the active region has a pair of quantum dots opposite to each other; a pair of semiconductor regions symmetrically arranged in such a way that each of tunnel junctions is formed at the outer sides of the quantum dots and is positioned between the semiconductor regions; two ports formed on the active region, having the quantum dots placed between them; a control gate formed between the quantum dots; a pair of side gates formed in such a manner that their ends are respectively located on the quantum dots; and a gate oxide layer formed between the active region and the control gate, wherein impurity ions are implanted into the side gates and the active region to dope the side gates and define ion-implanted semiconductor regions. The side gates, the control gate and the two ports are simultaneously formed on the same plane using electron beam lithography.

ADVANTAGEOUS EFFECTS

The present invention can obtain the following advantageous effects.

First of all, four basic logic operations NAND, NOR, OR and AND can be performed using a single device so that the integration of the device can be improved. Furthermore, while a conventional CMOS based 64 Mb DRAM requires approximately million electrons and a conventional CMOS based 16 Mb DRAM requires ten-thousand electrons to store 1-bit information, the present invention can remarkably reduce power consumption from mW to µW because the present invention processes data using only a single electron.

Moreover, logical operations on multi-valued signals 0, 1, 2, 3, . . . can be performed using gate voltages of single electron transistors according to periodic Coulomb oscillation, and thus device integration can be further improved in particular, a cell can have its own operation function even though an additional logic circuit is not formed outside the cell. This can improve the integration of a chip and reduce power consumption.

DESCRIPTION OF DRAWINGS

Further objects and advantages of the invention can be more fully understood from the following detailed description taken in conjunction with the accompanying drawings, in which.

MODE FOR INVENTION

Preferred embodiments of the present invention will be explained with reference to the attached drawings.

Figure 1:
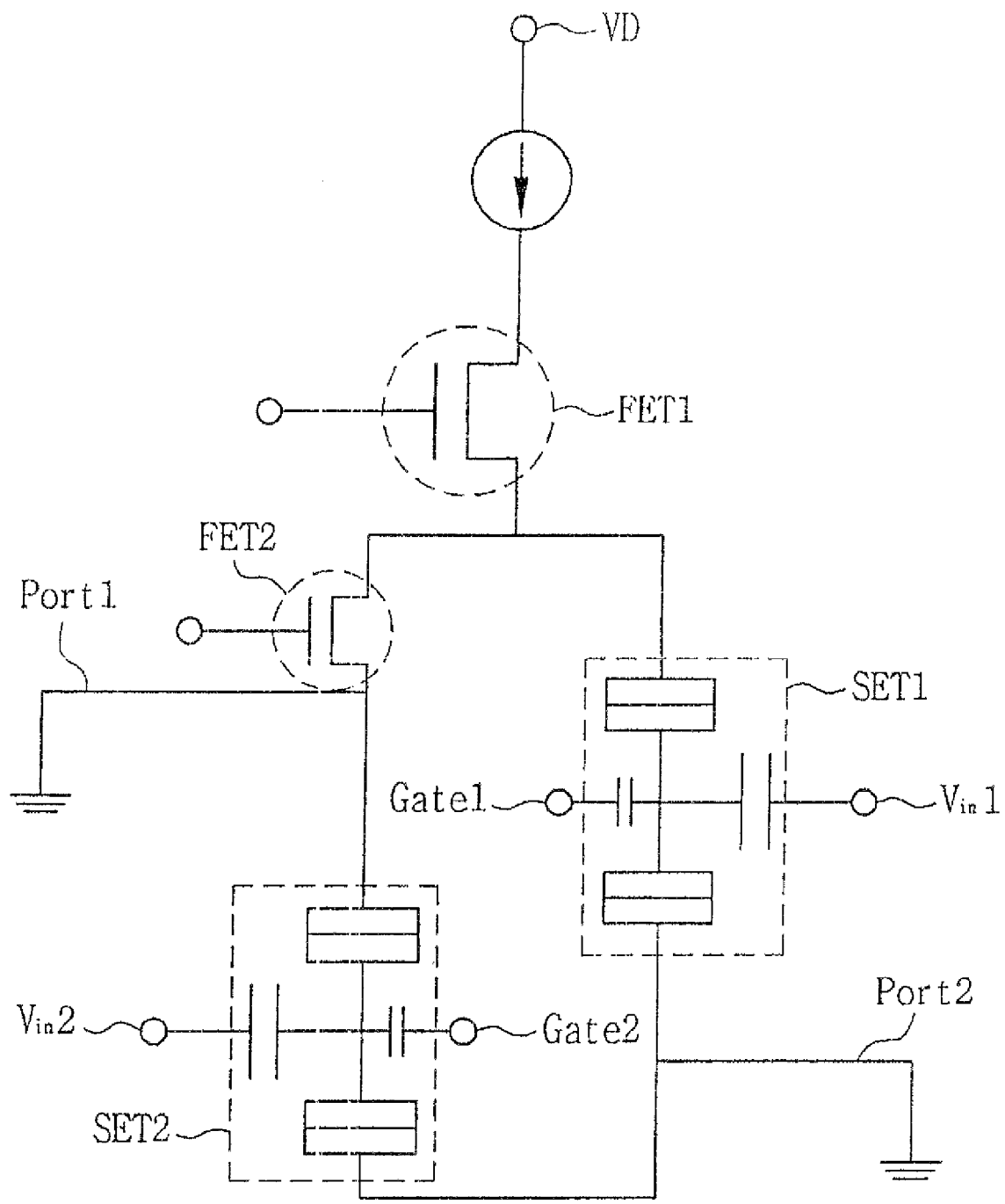
FIG. 1 is a circuit diagram of a single electron based flexible multi-functional logic circuit convertible to four basic logic gates according to the present invention.

FIG. 1 is a circuit it diagram of a single electron based flexible multi-functional logic circuit convertible to four basic logic gates according to the present invention. In a preferred embodiment of the present invention, the flexible multi-functional logic circuit includes two single electron transistors. However, the flexible multi-functional logic circuit can have more than two single electron transistors in parallel and field effect transistors respectively corresponding to the single electron transistors.

Referring to FIG. 1, the single electron based flexible multi-functional logic circuit according to the present invention includes at least first and second single electron transistors SET1 and SET2, a constant current source VD for supplying a predetermined drain current to the first and second single electron based transistors SET1 and SET2, field effect transistors FET1 and FET2 respectively corresponding to the single electron transistors SET1 and SET2, and two ports Port1 and Port2 for which a current flow direction is changed according to connection states of the first and second single electron transistors SET1 and SET2.

The first and second single electron transistors SET1 and SET2 are connected in parallel with each other and respectively include side gates Gate1 and Gate2 and input voltage ports Vin1 and Vin2.

The first field effect transistor FET1 is connected to the constant current source VD for supplying a predetermined drain voltage and applies the drain voltage to the first and second single electron transistors SET1 and SET2, as shown in FIG. 1. The second field effect transistor FET2 is serially connected to the second single electron transistor SET2 and blocks the drain voltage from the constant current source VD from being applied to the second single electron transistor SET2 when a fixed voltage is applied to the side gate Gate2 of the second single electron transistor SET2.

As shown in FIG. 1, two ports Port1 and Port2 are positioned between the first and second single electron transistors SET1 and SET2 in such a way as to be opposite to each other, and function as a drain and a source according to whether the second field effect transistor FET2 is turned on or off.

The operation of the single electron based flexible multi-functional logic circuit according to the present invention will be explained with reference to the attached drawings.

Figure 2:
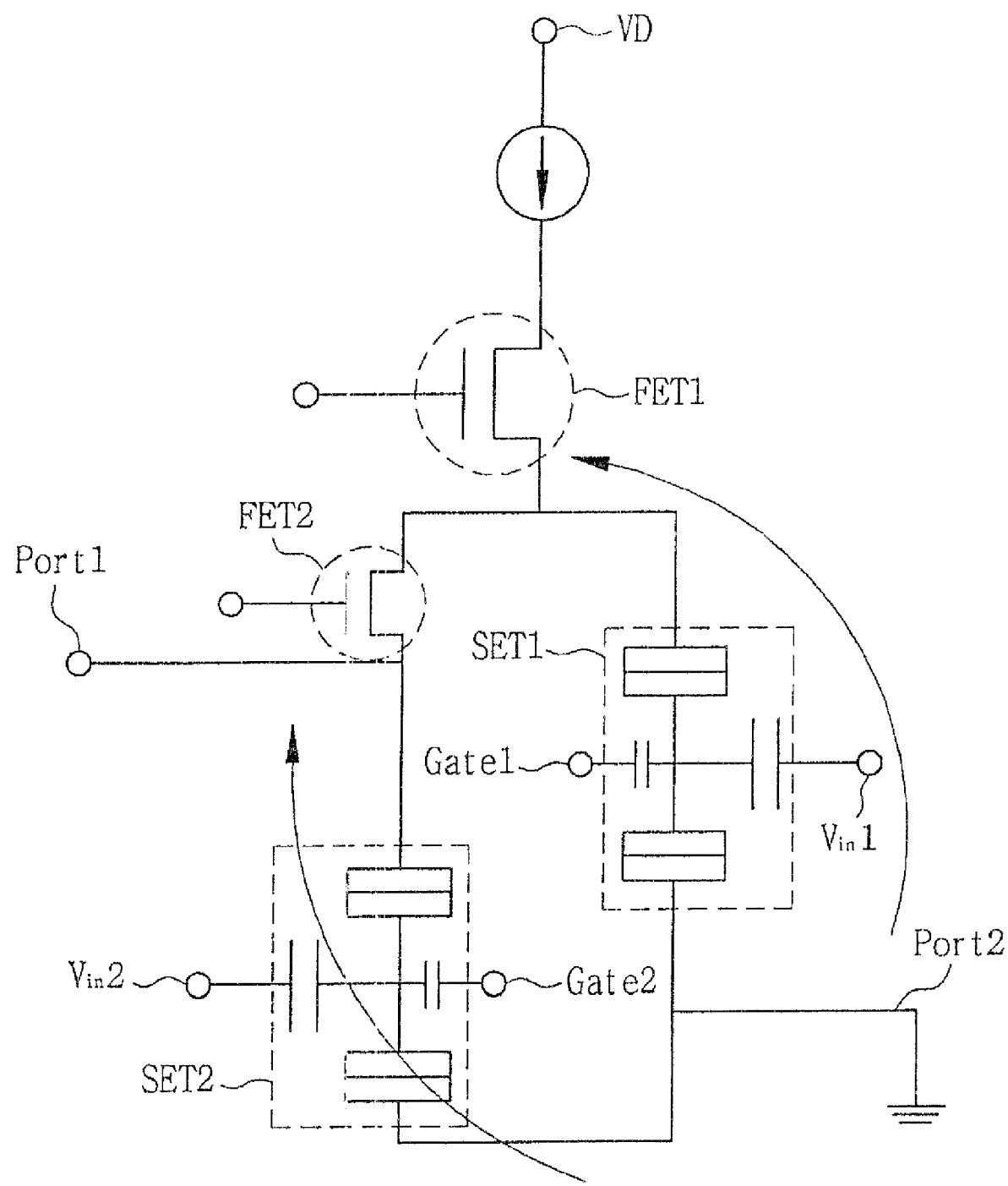
FIG. 2 is a circuit diagram for explaining conversion of the single electron based flexible multi-functional logic circuit according to the present invention to a NOR gate.

FIG. 2 is a circuit diagram for explaining conversion of the single electron based flexible multi-functional logic circuit according to the present invention to a NOR gate.

The single electron based flexible multi-functional logic circuit according to the present invention maintains the drain voltage of the first and second single electron transistors SET1 and SET2, supplied from the constant current source VD, when a fixed voltage VG-FET1 is applied to the gate of the first field effect transistor FET1. Here, the drain voltage is sufficiently low so that coulomb blockade condition of the first and second single electron transistors SET1 and SET2 can be maintained. Accordingly, drain currents of the first and second single electron transistors SET1 and SET2 are periodically increased and decreased according to input voltages Vin1 and Vin2 of the first and second single electron transistors SET1 and SET2.

In this state, when a fixed voltage VG-FET2 is applied to the gate of the second field effect transistor FET2, the first and second single electron transistors SET1 and SET2 are connected in parallel with each other. Here, when a square wave signal having values "0" and "1" is periodically applied to the input voltage ports Vin1 and Vin2 of the first and second single electron transistors SET1 and SET2, an output voltage Vout corresponds to "1" only when an input voltage is "0" and the output voltage Vout corresponds to "0" in other cases.

To apply the predetermined drain voltage to the first and second single electron transistors SET1 and SET2, the port Port 2 becomes a source and the port Port1 is floated. Accordingly, currents simultaneously flow from the source Port2 to the first and second single electron transistors SET1 and SET2, as indicated by arrows in FIG. 2, and thus the logic circuit can perform a NCR operation.

When voltages are respectively applied to the side gates Gate1 and Gate2 of the first and second single electron transistors SET1 and SET2 to control phases of Coulomb oscillations provided by the first and second single electron transistors SET1 and SET2 by 180°, the logic circuit can perform an AND operation without having an additional circuit configuration.

Figure 3:
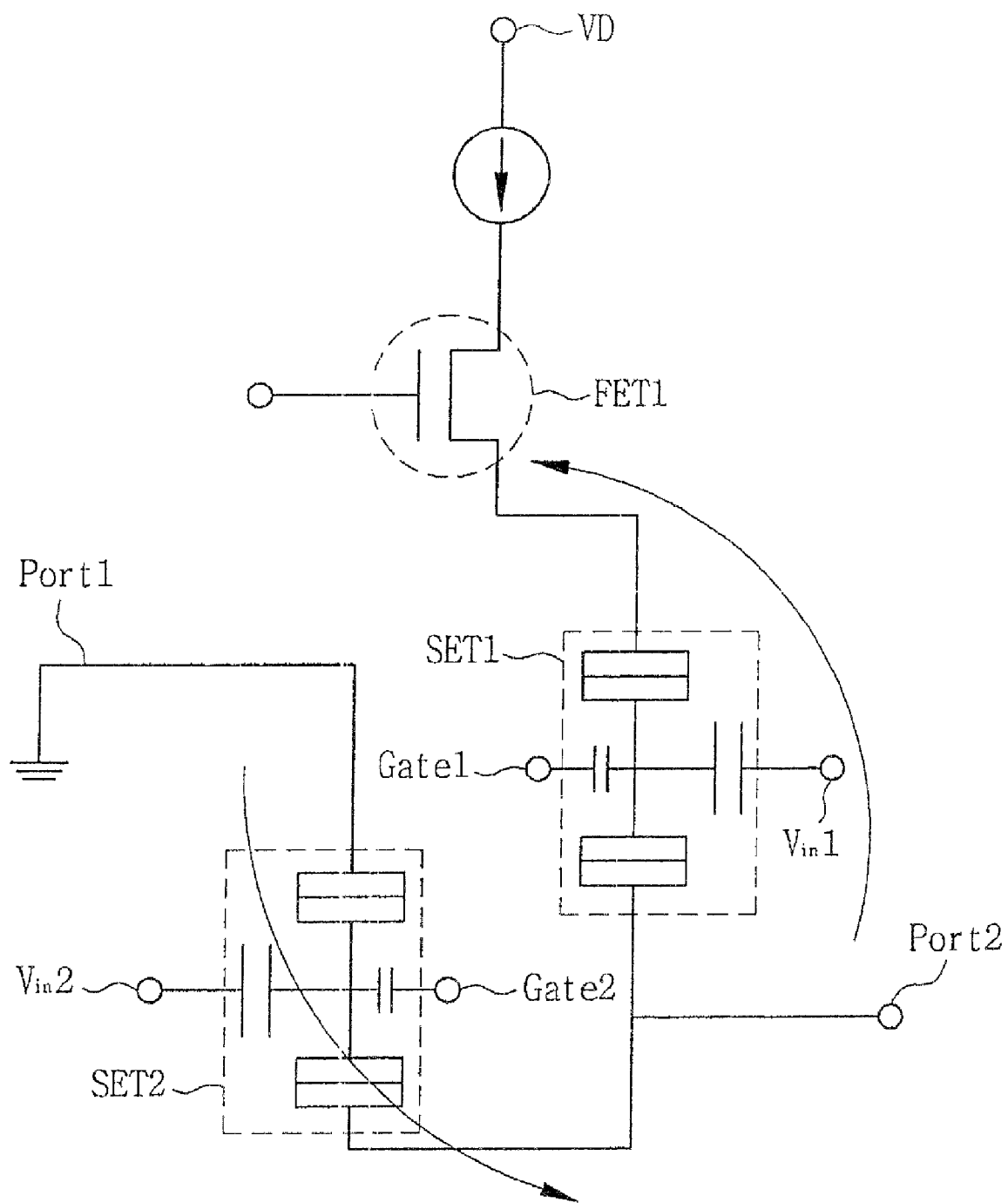
FIG. 3 is a circuit diagram for explaining conversion of the single electron based flexible multi-functional logic circuit according to the present invention to a NAND gate.

FIG. 3 is a circuit diagram for explaining conversion of the single electron based flexible multi-functional logic circuit according to the present invention to a NAND gate.

When a voltage is applied to the gate of the first field effect transistor FET1 and any voltage is not applied to the gate of the second field effect transistor FET2, the first and second single electron transistors SET1 and SET2 are serially connected, as illustrated in FIG. 3.

In this state, when a square wave signal having values "0" and "1" is periodically applied to the input voltage ports Vin1 and Vin2 of the first and second single electron transistors SET1 and SET2, the output voltage Vout becomes "0" when a voltage corresponding to "1" is applied to the input voltage ports Vin1 and Vin2 and the output voltage Vout becomes "1" in other cases. Here, the port Port1 functions as a source and the port Port2 is floated, and thus a current flows from the source Port1 to the second single electron transistor SET2 via the first single electron transistor SET1, as indicated by arrows in FIG. 3. Accordingly, the logic circuit can perform a NAND operation.

When voltages Vsg1 and Vsg2 are respectively applied to the side gates Gate1 and Gate2 of the first and second single electron transistors SET1 and SET2 to control phases of Coulomb oscillations provided by the first and second single electron transistors SET1 and SET2 by 180°, the logic circuit can perform an OR operation without having an additional circuit configuration.

While the logic circuit performs logical operations on signals having values "0" and "1" in the current embodiment of the present invention, the logic circuit can carry out logical operations on multi-valued signals "0", "1", "2", "3", "4", . . . using Coulomb oscillations provided by the single electron transistors.

A configuration of the single electron based flexible multi-functional logic circuit according to the present invention will be explained with reference to the attached drawings.

Figure 4:
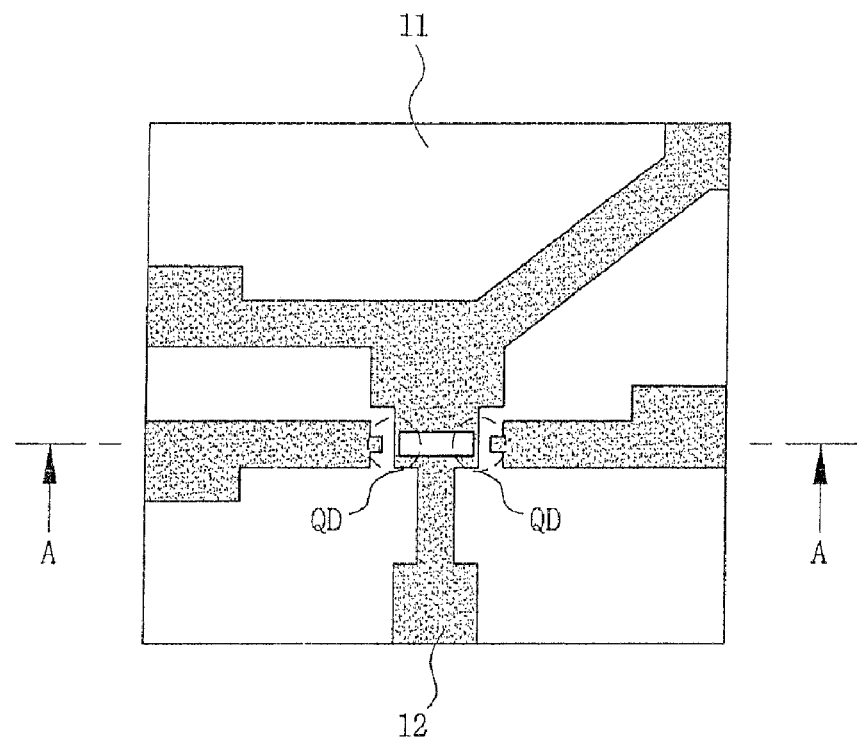
FIGS. 4 and 5 are plan views illustrating a configuration of the single electron based flexible multi-functional logic circuit according to the present invention.
Figure 5:
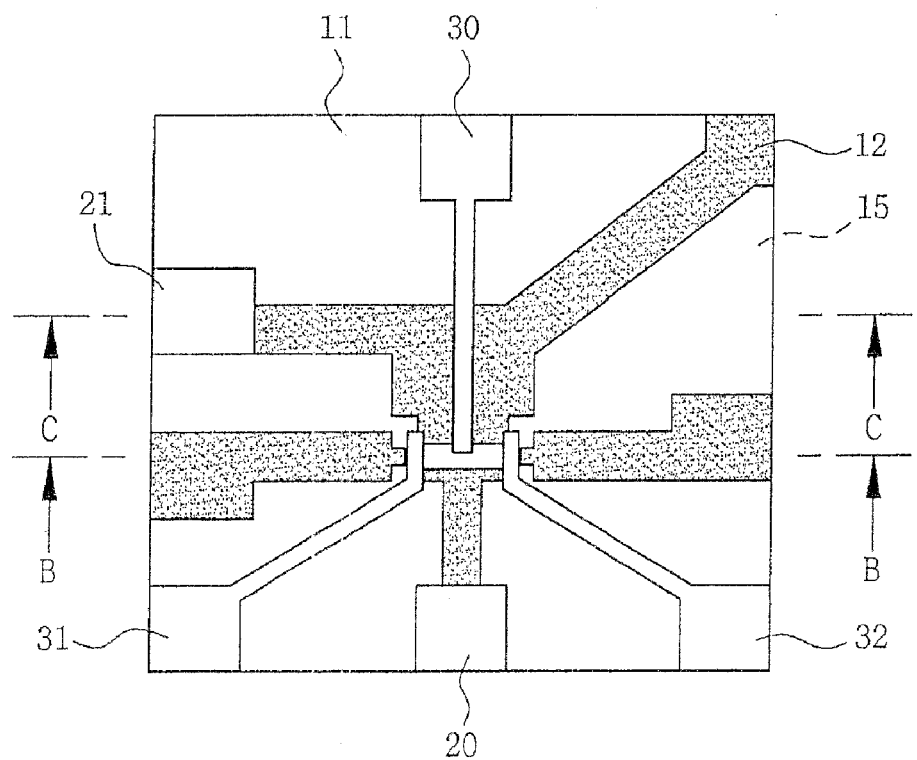
Figure 6:
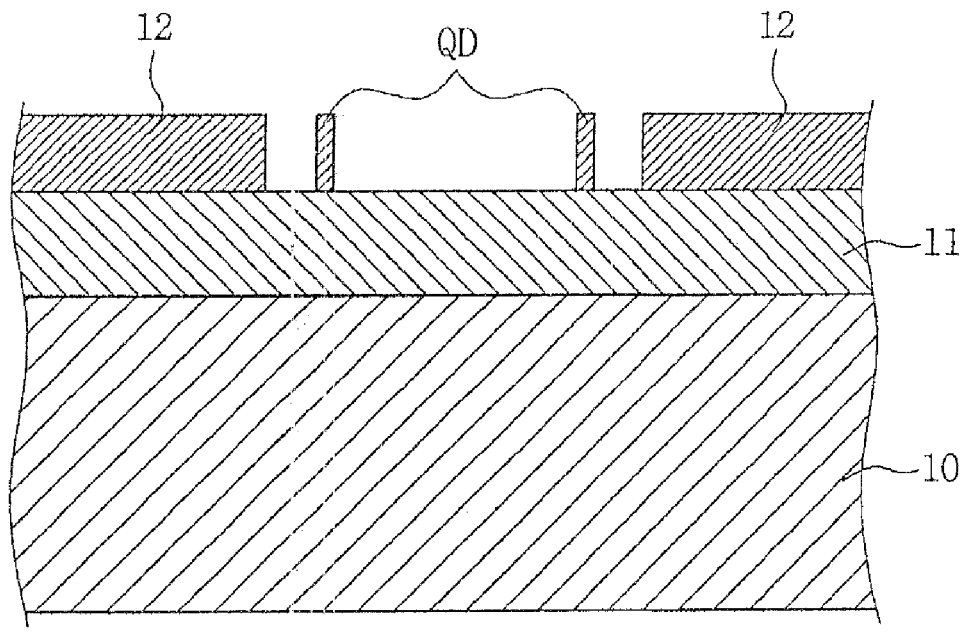
FIGS. 6, 7 and 8 are cross-sectional views taken long lines A-A, B-B and C-C of FIGS. 4 and 5.
Figure 7:
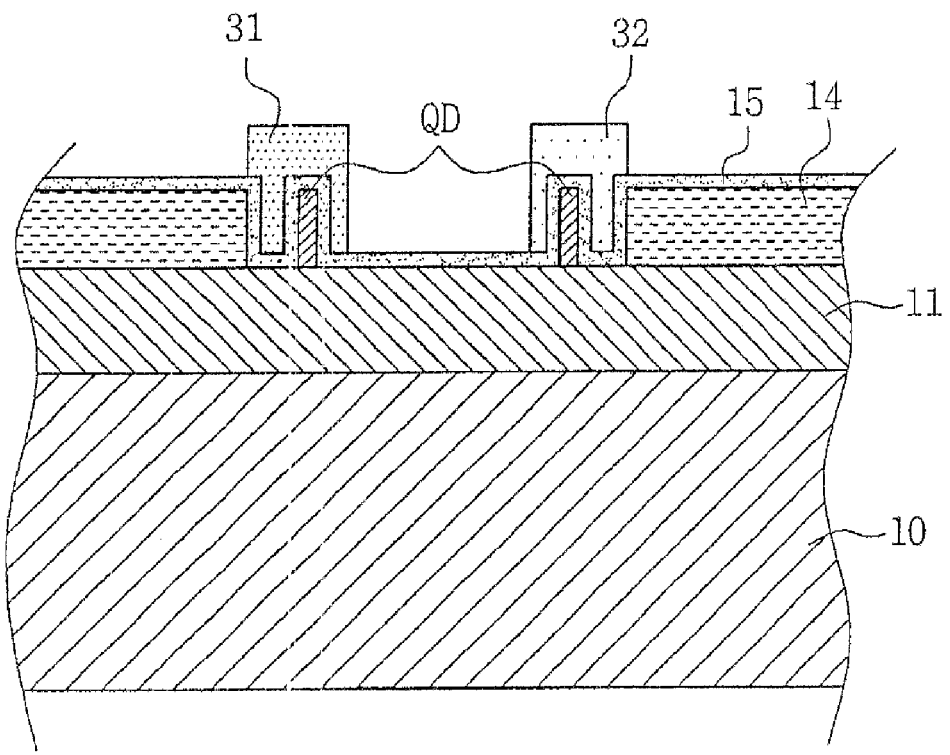
Figure 8:
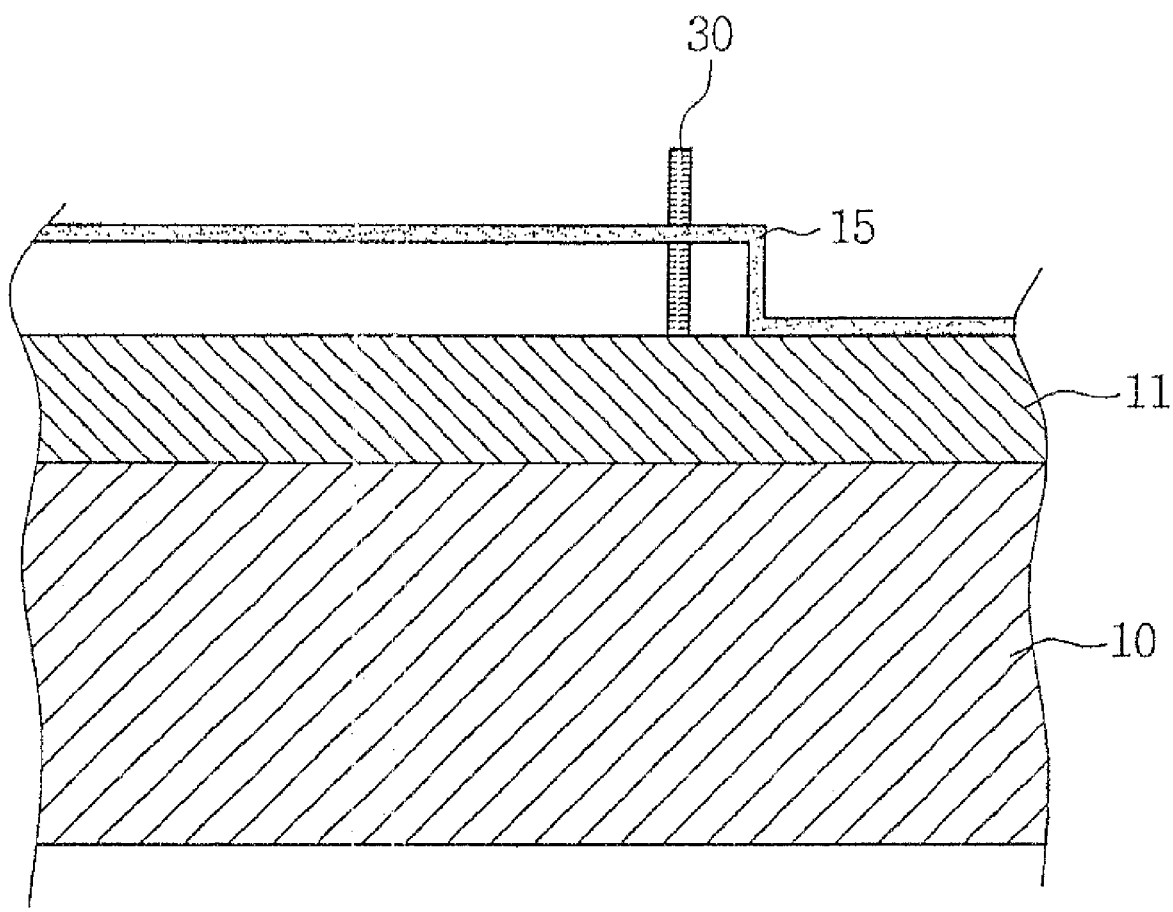

FIGS. 4 and 5 are plan views illustrating the configuration of the single electron based flexible multi-functional logic circuit according to the present invention, and FIGS. 6, 7 and 8 are cross-sectional views taken long lines A-A, B-B and C-C of FIG. 4, respectively.

An active region 12 is defined such that a channel is formed in an insulating layer 11 formed on a semiconductor substrate 10. The active region 12 is in such a manner that two adjacent quantum dots QD are formed at the left and the right sides of the active region 12, respectively, having a predetermined distance between the quantum dots, as illustrated in FIGS. 4 and 6.

In a preferred embodiment of the present invention, the distance between the two quantum dots QD is determined such that the distance does not affect input voltage signals of the first and second single electron transistors SET1 and SET2.

In the active region 12, semiconductor regions 14 are formed as a part of the active region 12. The semiconductor regions 14 are arranged having tunnel junctions formed at the outer sides of the quantum dots QD and positioned between the semiconductor regions 14. The active region 12 and the semiconductor regions 14 are formed on the same plane.

Two ports 20 and 21 and three gates 30, 31 and 32 are formed on the active region 12. The two ports 20 and 21 are used as a source and a drain, as described above, and formed at positions where the two ports 20 and 21 can be connected with each other through the active region 12. The gates 31 and 32 respectively correspond to the side gates of the first and second single electron transistors SET1 and SET2. The gates 31 and 32 are formed such that their ends are respectively located on the quantum dots QD. The gate 30 corresponds to the gate of the second field effect transistor FET2 and functions as a control gate for determining a serial/parallel connection state of the first and second single electron transistors SET1 and SET2. The gate 30 is located between the quantum dots QD.

In a preferred embodiment of the present invention, a gate oxide layer 15 is formed between the active region 12 and the control gate 30, as illustrated in FIGS. 5, 7 and 8, and impurity ions are implanted into regions between the gates 31 and 32 and the active region 12 to dope the gates 31 and 32 and define ion-implanted semiconductor regions 14.

Furthermore, it is preferable that the side gates 31 and 32, the control gate 30 and the two ports 20 and 21 are simultaneously formed on the same plane using electron beam lithography.

Accordingly, portions of the semiconductor regions 14, which are placed under the gates 31 and 32, are not ion-implanted, and thus current does not flow even though a source-drain voltage is applied when the field effect transistor is not operated. Furthermore, a single logic circuit can be operated as four basic logic circuits by varying the positions of the ports 20 and 21 and applying a voltage to the gate of the second field effect transistor FET2 or not.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A single electron based flexible multi-functional logic circuit comprising:
   first and second single electron transistors SET1 and SET2 respectively having side gates Gate1 and Gate2 and input voltage ports Vin1 and Vin2;
   a constant current source VD for supplying a predetermined current;
   a first field effect transistor FET1 for maintaining a predetermined drain voltage applied to the first and second single electron transistors SET1 and SET2 by the constant current source VD;
   at least a second field effect transistor FET2 for determining flow of current to the first and second single electron transistors SET1 and SET2; and
   two ports Port1 and Port2 for changing a current flow direction depending on whether the second field effect transistor FET2 is turned on or off.

2. The single electron based flexible multi-functional logic circuit according to claim 1, wherein the first and second single electron transistors SET1 and SET2 are connected in parallel with each other to construct a logic NOR circuit when the second field effect transistor FET2 is turned on.

3. The single electron based flexible multi-functional logic circuit according to claim 1 or 2, wherein a voltage is applied to the side gates of the first and second single electron transistors SET1 and SET2 to control phases of Coulomb oscillations of the first and second single electron transistors by 180° to construct a logic AND circuit when the second field effect transistor FET2 is turned on.

4. The single electron based flexible multi-functional logic circuit according to any one of claims 1 to 3, wherein the first and second single electron transistors SET1 and SET2 are serially connected to construct a logic NAND circuit when the second field effect transistor FET2 is turned off.

5. The single electron based flexible multi-functional logic circuit according to any one of claims 1 to 3, wherein a voltage is applied to the side gates of the first and second single electron transistors SET1 and SET2 to control phases of Coulomb oscillations of the first and second single electron transistors by 180° to construct a logic OR circuit when the second field effect transistor FET2 is turned off.

6. The single electron based flexible multi-functional logic circuit according to claim 1, wherein the second field effect transistor FET2 is a depletion transistor.

7. The single electron based flexible multi-functional logic circuit according to claim 1, wherein the side gates Gate1 and Gate2 change a phase difference of Coulomb oscillations by 180°.

8. A single electron based flexible multi-functional logic circuit comprising:

an active region defined in an insulating layer formed on a semiconductor substrate such that the active region has a pair of quantum dots opposite to each other;

a pair of semiconductor regions symmetrically arranged in such a way that each of tunnel junctions is formed at the outer sides of the quantum dots and is positioned between the semiconductor regions;

two ports formed on the active region, having the quantum dots placed between them;

a control gate formed between the quantum dots;

a pair of side gates formed in such a manner that their ends are respectively located on the quantum dots; and a gate oxide layer formed between the active region and the control gate, wherein impurity ions are implanted into the side gates and the active region to dope the side gates and define ion-implanted semiconductor regions.

9. The single electron based flexible multi-functional logic circuit according to claim 8, wherein the pair of side gates, the control gate and the two ports are simultaneously formed on the same plane using electron beam lithography.

* * * * *